(12) United States Patent
Takai

(10) Patent No.: US 9,991,143 B2
(45) Date of Patent: Jun. 5, 2018

(54) CARRIER TRANSPORT SYSTEM AND TRANSPORT METHOD

(71) Applicant: Murata Machinery, Ltd., Kyoto-shi, Kyoto (JP)

(72) Inventor: Kaname Takai, Inuyama (JP)

(73) Assignee: Murata Machinery, Ltd. (JP)

( * ) Notice: Subject to any disclaimer, the term of this patent is extended or adjusted under 35 U.S.C. 154(b) by 50 days.

(21) Appl. No.: 15/316,478

(22) PCT Filed: Apr. 30, 2015

(86) PCT No.: PCT/JP2015/062941
§ 371 (c)(1),
(2) Date: Dec. 5, 2016

(87) PCT Pub. No.: WO2015/194267
PCT Pub. Date: Dec. 23, 2015

(65) Prior Publication Data
US 2017/0194182 A1 Jul. 6, 2017

(30) Foreign Application Priority Data
Jun. 19, 2014 (JP) .................................. 2014-126013

(51) Int. Cl.
*H01L 21/677* (2006.01)
(52) U.S. Cl.
CPC .............................. *H01L 21/67733* (2013.01)
(58) Field of Classification Search
CPC ......... H01L 21/67733; H01L 21/67739; H01L 21/67766; H01L 21/67775
(Continued)

(56) References Cited

U.S. PATENT DOCUMENTS

| 8,123,456 B2 | 2/2012 | Wakabayashi |
| 2010/0003111 A1 | 1/2010 | Yeo et al. |

(Continued)

FOREIGN PATENT DOCUMENTS

| JP | 2009-059775 A | 3/2009 |
| JP | 2010-016387 A | 1/2010 |

(Continued)

OTHER PUBLICATIONS

English language translation of International Search Report dated Jul. 21, 2015 issued in corresponding PCT application PCT/JP2015/062941.

*Primary Examiner* — Kaitlin S Joerger
(74) *Attorney, Agent, or Firm* — DLA Piper LLP (US)

(57) ABSTRACT

Carriers to be temporarily stored are increased in number, without providing a local vehicle with a lateral transfer mechanism. Carriers are transported between load ports of equipment by overhead travelling vehicles and local vehicles, both provided with a hoist, and the overhead travelling vehicles are provided with a lateral transfer mechanism for laterally moving the hoist. A travelling rail for the overhead travelling vehicles is provided so as to pass over a load port, and a travelling rail for the local vehicle is provided below the travelling rail for the overhead travelling vehicles and over the load port. Slidable buffers are provided and configured to slide between forward positions under the travelling rail for the local vehicle and rearward positions laterally separated from the positions under the travelling rail for the local vehicle. A space over the slidable buffers at the rearward position is open for the transfer of carriers.

7 Claims, 12 Drawing Sheets

(58) Field of Classification Search
USPC .......................................................... 414/281
See application file for complete search history.

(56) References Cited

U.S. PATENT DOCUMENTS

2012/0114453 A1    5/2012  Ota et al.
2012/0275886 A1   11/2012  Ota

FOREIGN PATENT DOCUMENTS

JP        2012-111635 A    6/2012
JP        2012-114406 A    6/2012

40

F I G. 5
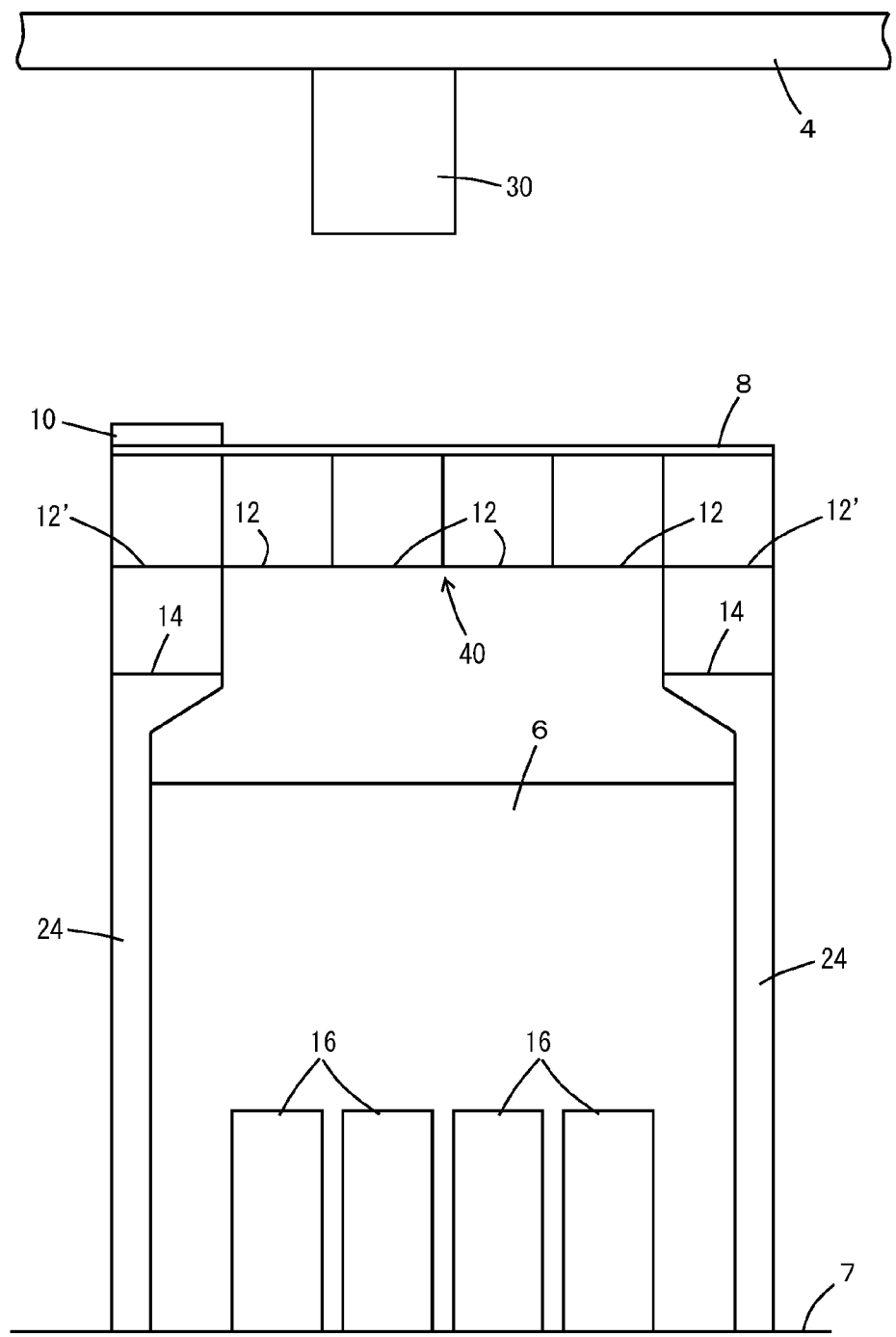

CARRIER TRANSPORT SYSTEM AND TRANSPORT METHOD

CROSS REFERENCE TO RELATED APPLICATIONS

This application is a national stage of international application no. PCT/JP2015/062941, filed on Apr. 30, 2015, and claims the benefit of priority under 35 USC 119 of Japanese application no. 2014-126013, filed on Jun. 19, 2014, both of which are incorporated herein by reference in their entirety.

BACKGROUND OF THE INVENTION

Field of the Invention

The present invention relates to transporting a carrier in which a semiconductor wafer or the like is housed.

Description of the Related Art

In order to improve the utilisation rate of semiconductor fabrication equipment, temporal storage apparatuses (buffers) are provided in the vicinity of load ports of semiconductor fabrication equipment. In this regard, Patent Literature 1 (JP 2012-111635) by the applicant has proposed to provide a travelling rail for a local vehicle in parallel with and below a travelling rail for overhead travelling vehicles (overhead hoist transports (OHT)). If buffers suitable for transfer between the local vehicle and between the overhead travelling vehicles are provided at positions under the travelling rail for the local vehicle and not over the load ports, for example, four buffers may be provided. If the buffers are not sufficient in their number, then, providing the overhead travelling vehicles and the local vehicle with a lateral transfer mechanism for carriers and providing additional buffers at downward and sideway positions from the travelling rail for the local vehicle are a possible design for increasing the number of buffers.

CITATION LIST

Patent Literature

Patent Literature 1: JP2012-111635

SUMMARY OF THE INVENTION

Problem to be Solved by the Invention

However, if the local vehicle is provided with a lateral transfer mechanism for carriers, then, the height of the local vehicle increases. Therefore, it is necessary to increase the number of carriers that can be temporarily stored, without increasing the height of the local vehicle. The problem to be solved by the present invention is to increase the number of carriers that can be temporarily stored, without providing the local vehicle with a lateral transfer mechanism.

Means for Solving Problem

A transport system according to one aspect of the invention for transporting carriers between load ports of equipment, comprising:
overhead travelling vehicles provided with a hoist for raising and lowering carriers and a lateral transfer mechanism laterally moving the hoist;
a travelling rail for the overhead travelling vehicles provided in a ceiling space of a building and passing over a load port;
a local vehicle provided with a hoist for raising and lowering carriers;
a travelling rail for the local vehicle, provided at a position below the travelling rail for the overhead travelling vehicles and over the load port;
at least one slidable buffer configured to slide between a forward position under the travelling rail for the local vehicle and a rearward position laterally separated from the position under the travelling rail for the local vehicle and to support a carrier thereon; and
a buffer controller configured and programmed to control the local vehicle and the slidable buffer,
wherein a space above the slidable buffer at the rearward position is open for transfer of carriers,
wherein the overhead travelling vehicles are configured and programmed to transfer carriers between the load port and the slidable buffer located at the rearward position,
wherein the local vehicle is configured to transfer carriers between the load port and the slidable buffer located at the forward position,
wherein the travelling rail for the local vehicle extends from the position over the load port to a waiting position for the local vehicle shifted from the position over the load port, and
wherein the local vehicle is configured to wait at the waiting position.

A carrier transport method according to one aspect of the invention for transporting carriers between load ports of equipment uses a transport system comprising:
overhead travelling vehicles provided with a hoist for raising and lowering carriers and a lateral transfer mechanism laterally moving the hoist;
a travelling rail for the overhead travelling vehicles provided in a ceiling space of a building and passing over a load port;
a local vehicle provided with a hoist for raising and lowering carriers;
a travelling rail for the local vehicle, provided at a position below the travelling rail for the overhead travelling vehicles and over the load port;
at least one slidable buffer configured to slide between a forward position under the travelling rail for the local vehicle and a rearward position laterally separated from the position under the travelling rail for the local vehicle and configured to support a carrier thereon; and
a buffer controller configured and programmed to control the local vehicle and the slidable buffer,
wherein a space above the slidable buffer at the rearward position is open for transfer of carriers, and
wherein the travelling rail for the local vehicle extends from the position over the load port to a waiting position for the local vehicle shifted from the position over the load port, and
said method comprises:
transferring carriers by the overhead travelling vehicles between the load port and the slidable buffer located at the rearward position;
transferring carriers by the local vehicle between the load port and the slidable buffer located at the forward position; and
making the local vehicle wait at the waiting position.

The local vehicle and the overhead travelling vehicles are configured to operate as described above according to a program for an on-board controller or a program for a host controller. In the present specification, descriptions regarding the transport system for carriers apply to the transport method for carriers as they are, and descriptions regarding the transport method for carriers apply to the transport system for carriers as they are. Preferably, one row of slidable buffers is provided on one side of the travelling rail for the local vehicle along the travelling direction, or two rows of slidable buffers are provided on both sides of the travelling rail along the travelling direction.

According to the present invention, the number of carriers that are stored is increased by the slidable buffer. The slidable buffer is configured to advance over the load port and may be provided other positions than the ends of the travelling rail for the local vehicle, and therefore, a larger number of slidable buffers may be provided. The overhead travelling vehicles transfer carriers between the slidable buffer located at the rearward position, and the local vehicle transfers carriers between the local vehicle located at the forward position. Therefore, the control for the slidable buffer becomes easy. Since the local vehicle waits at a position separated from a position over the load port, a problem with the local vehicle does not prevent the transfer between the load port and the overhead travelling vehicles.

The overhead travelling vehicles are provided with a lateral transfer mechanism, and in general, the overhead travelling vehicles can transfer carriers between a slidable buffer located at the rearward position and a slidable buffer located at the forward position. The overhead travelling vehicles transfer carriers between the slidable buffer located at the rearward position by their own control or the control of the host controller. Then, transfer between the overhead travelling vehicle and the slidable buffer does not prevent the travelling of the local vehicle or transfer between the load port. The local vehicle may move to the waiting position by its own control or by an instruction from a host controller such as the buffer controller according to the embodiment.

Preferably, at least a fixed buffer configured to support carriers thereon, at a position under the travelling rail for the local vehicle, including an area under the waiting position, and not over the load port is provided. Then, the number of buffers can be further increased. When the fixed buffer is provided at a position lower than the slidable buffer by a height corresponding to one carrier, further slidable buffer may be provided such that it advances to a position over the fixed buffer.

Preferably, the slidable buffer includes a slidable buffer configured to slide to one side of the travelling rail for the local vehicle and a slidable buffer configured to slide to another side of the travelling rail for the local vehicle. And the lateral transfer mechanism of the overhead travelling vehicles is configured to laterally move the hoist to both sides of the travelling rail for the overhead travelling vehicles, and the overhead travelling vehicles are configured and programmed to transfer carriers between slidable buffers located at the rearward position, for both the slidable buffer configured to slide to one side and the slidable buffer configured to slide to another side. Thus, slidable buffers are provided on both sides of the travelling rail for the local vehicle and they transfer carriers between the overhead travelling vehicles.

Preferably, terminals are provided along the travelling rail for the overhead travelling vehicles for communication between the overhead travelling vehicles and the buffer controller;

terminals are provided along the travelling rail for the local vehicle for communication between the local vehicle and the buffer controller, the slidable buffer comprises a base fixed at the rearward position and a movable pedestal movable back and forth between the forward position and a position over the base, a sensor configured to detect the pedestal located at the forward position and a sensor configured to detect the pedestal located at the position over the base are further provided, the local vehicle is configured and programmed to request the buffer controller via a terminal for permission to enter a position over the load port prior to entering and permission to transfer between the slidable buffer prior to transfer, the overhead travelling vehicles are configured and programmed to request the buffer controller via a terminal for permission to transfer between the load port prior to transfer between the load port and permission to transfer between the slidable buffer prior to transfer between the slidable buffer, the buffer controller is configured and programmed to permit via a terminal the local vehicle to enter if there is no interference with transfer between the overhead travelling vehicles and the load port, to permit via a terminal the local vehicle to transfer if the slidable buffer is located at the forward position, to permit via a terminal the overhead travelling vehicles to transfer between the load port if there is no interference with the entrance of the local vehicle, and to permit via a terminal the overhead travelling vehicles to transfer between the slidable buffer if the slidable buffer is located at the rearward position.

According to this aspect, the interference between transfer by the overhead travelling vehicle to/from a load port and the travelling of the local vehicle is excluded by communication via the terminals. Therefore, the interference between the overhead travelling vehicle and the local vehicle is excluded. Further, since the transfer is permitted on the detection of slidable buffer positions at the forward position or the rearward position, neither the overhead travelling vehicle nor the local vehicle attempts transfer between a slidable buffer not located at the desired position.

BRIEF DESCRIPTION OF THE DRAWINGS

FIG. 5 is a side view schematically showing main portions of the modification with an increased storage capacity.

DETAILED DESCRIPTION OF THE PREFERRED EMBODIMENTS

The best embodiment for carrying out the present invention is described in the following. The scope of the present invention is based on the claims and is to be construed with reference to the description and well-known techniques in the field in accordance with understanding of a person skilled in the art.

EMBODIMENT

Figure 1:
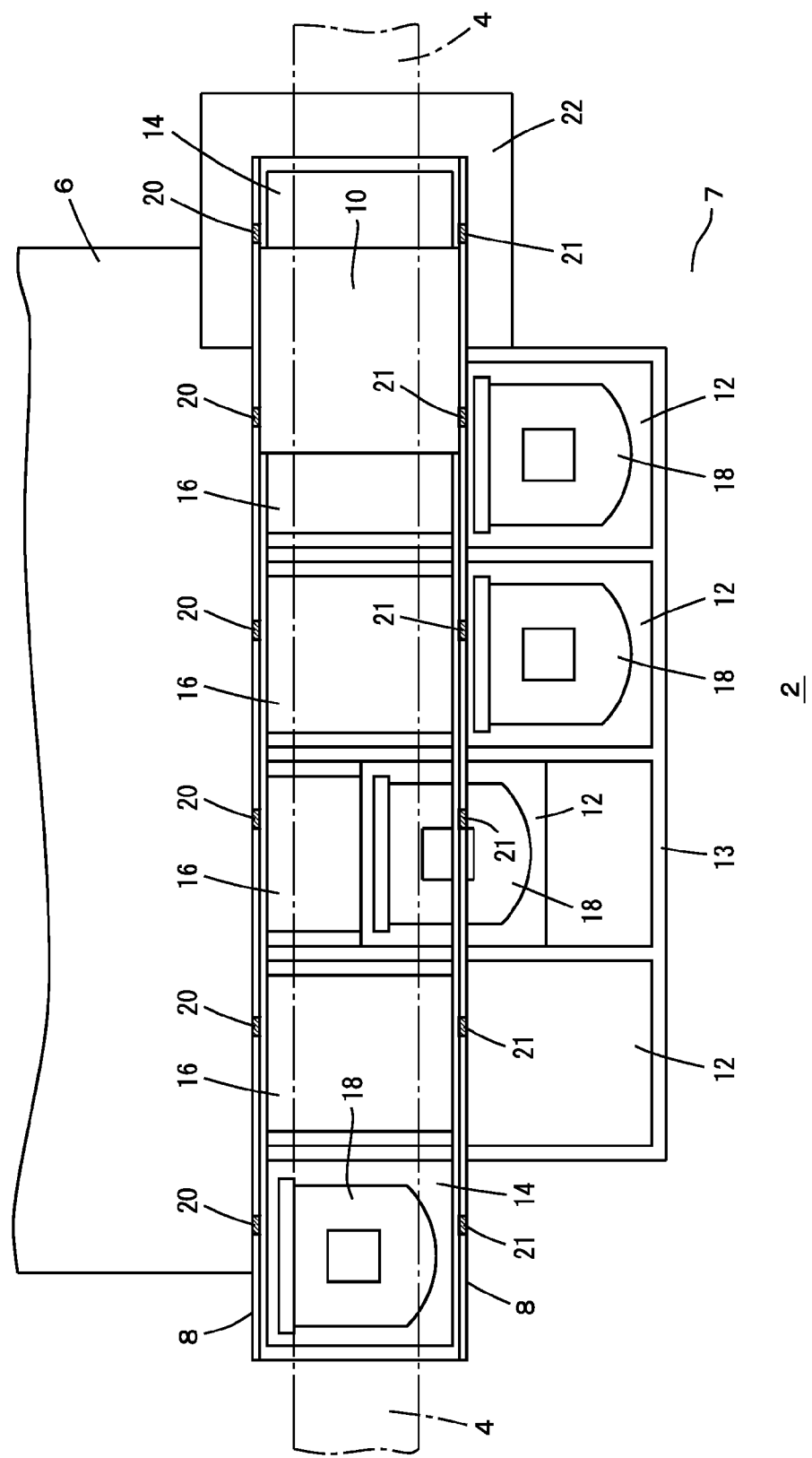
FIG. 1 is a plan view of main portions of a carrier transport system according to an embodiment.
Figure 2:
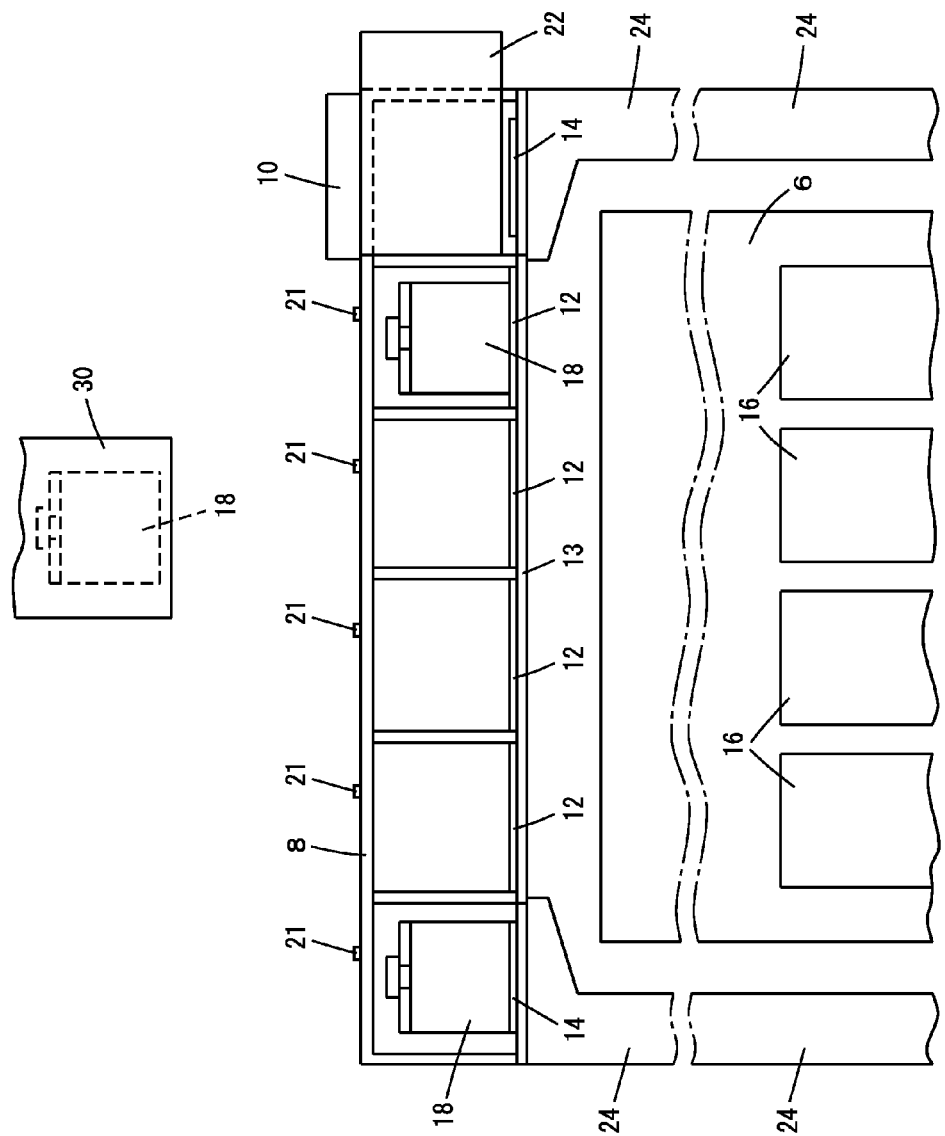
FIG. 2 is a fragmentary side view of the temporary storage apparatus for carriers according to the embodiment.
Figure 3:
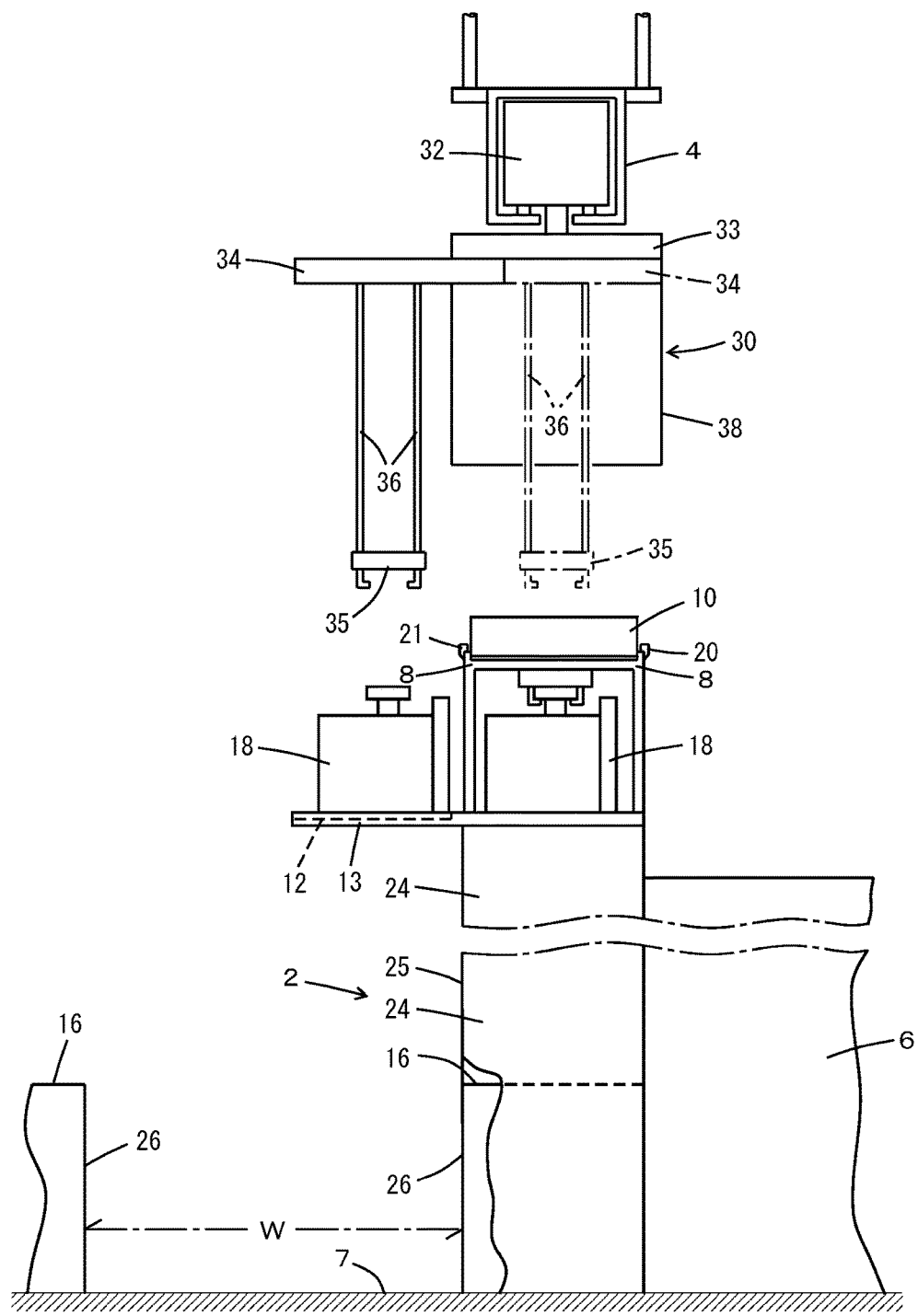
FIG. 3 is a partially cut-out front view of the carrier transport system according to the embodiment.

FIG. 1 to FIG. 12 show a transport system for carriers according to an embodiment, and a modification thereof. The transport system includes an overhead travelling vehicle system and a temporary storage apparatus 2 both provided in a cleanroom or the like. A travelling rail 4 for an overhead travelling vehicle (OHT) 30 shown in FIG. 3 is supported from the ceiling of the cleanroom. Reference numeral 6 indicates equipment for semiconductors or the like. Equipment includes an inspection apparatus and is provided with one or more load ports 16. Articles such as a semiconductor wafer and a reticle are housed in a carrier 18 such as a front-opening unified pod (FOUP), are temporarily stored in slidable buffers 12 and fixed buffers 14, and are transported by the overhead travelling vehicle (OHT) 30 and a local vehicle 10.

The temporary storage apparatus 2 is provided over a passage 7 in the cleanroom at a height without interference with people. On the uppermost part of the temporary storage apparatus 2, the local vehicle 10 travels along a pair of travelling rails 8,8 over the row of load ports 16 in parallel with the equipment 6. There is a gap between the travelling rails 8,8 for passing the carrier 18, and the overhead travelling vehicles 30 and the local vehicle 10 transfer the carrier 18 through the gap between the travelling rails 8,8.

The slidable buffers 12 are supported by a frame 13 of the temporary storage apparatus 2, at positions corresponding to the load ports 16 and so on. The slidable buffers 12 are configured to move back and forth between a forward position under the travelling rails 8, 8 and a rearward position separated from positions under the travelling rails 8, 8. Preferably, in addition to the slidable buffers 12, at least a fixed buffer 14 is provided at one or both ends of the travelling rails 8, 8. Positions over the load ports 16 and positions over the fixed buffers 14 are stopping positions for the local vehicle 10 and the overhead travelling vehicle 30, and the positions over the fixed buffers 14 also serve as waiting positions for the local vehicle 10. Slidable buffers 12 may be provided instead of the fixed buffers 14, and the fixed buffers 14 may be omitted. Since the positions not over the load ports 16 are used as the waiting positions for the local vehicle 10, troubles in the local vehicle 10 do not prevent the transfer between the load ports 16 and the overhead travelling vehicle 30.

Figure 10:
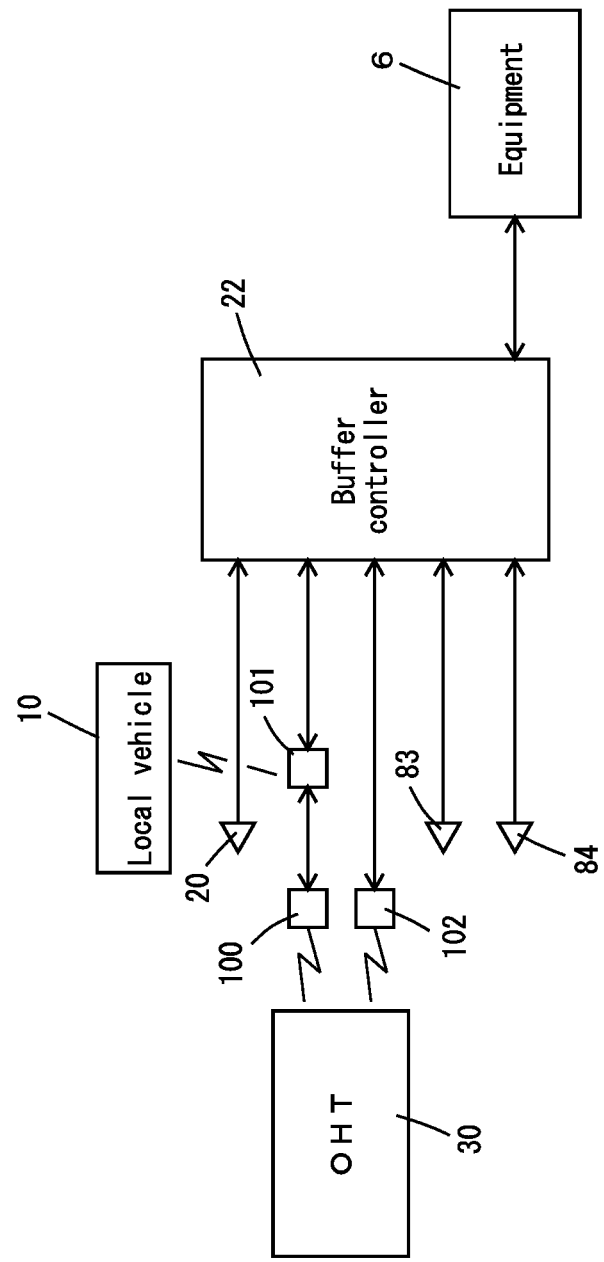
FIG. 10 is a block diagram showing an interlock mechanism according to the embodiment.

The stop positions for the local vehicle 10 and the overhead travelling vehicles 30 correspond one-to-one to the load ports 16 and the fixed buffers 14. Terminals 100 to 102 shown in FIG. 10 are provided at each stop position and establish interlock between the transfer by the overhead travelling vehicles 30 and the entrance of the local vehicle 10. Reference numerals 20 and 21 respectively indicate an optical sensor and a reflection plate, both provided at each stop position. The optical sensor 20 detects an elevation platform lowered from the overhead travelling vehicle 30, a belt suspending the elevation platform, or a carrier held by the elevation platform, when the light path between the optical sensor 20 and the reflection plate 21 is blocked. Reference numeral 22 indicates a buffer controller that controls the local vehicle 10 and the slidable buffers 12, establishes interlock between the overhead travelling vehicle 30 and the local vehicle 10, and communicates with the equipment 6.

As shown in FIGS. 2 and 3, the temporary storage apparatus 2 is supported by a pair of trestles 24 that have a gate-like shape. Front faces 25 of the trestles 24 toward the passage 7 are located, relative to the passage 7, at approximately the same position as front faces 26 of the load ports 16 or closer to the equipment 6 than the front faces 26. Therefore, the width W of the passage 7 is dependent on the positions of the load ports 16, and temporary storage apparatus 2 does not make the width W of the passage 7 narrower. "Approximately the same" means that the difference between the front faces is up to ±100 mm, particularly up to ±50 mm, and preferably the front faces 25 and 26 are located at substantially the same position. The temporary storage apparatus 2 may be suspended from the ceiling of the cleanroom or from the travelling rail 4 for the overhead travelling vehicles 30. However, it is easy to transport, install, and position the temporary storage apparatus 2 supported by the trestles 24 into the cleanroom. The trestles 24 having the front faces 25 not protruding toward the passage 7 over the load ports 16 do not make the passage narrower.

The structure of the overhead travelling vehicles 30 is shown in FIG. 0.3. A travelling unit 32 travels in the travelling rail 4 and also supports a lateral transfer mechanism 33 which laterally moves a raising and lowering drive 34 in a horizontal direction orthogonal to the travelling rail 4. The raising and lowering drive 34 feeds and winds up suspenders such as belts 36 to raise and lower an elevation platform 35 that holds and releases a carrier 18. A hoist comprises the raising and lowering drive 34, the elevation platform 35, and the belts 36. The optical sensor 20 already described detects the hoist and the carrier supported by the hoist. Reference numeral 38 indicates an anti-fall hood that prevents the carrier 18 from falling. In addition, a mechanism for rotating the raising and lowering drive 34 about a vertical axis may also be provided. For an overhead travelling vehicle without the lateral transfer mechanism 33, the slidable buffers 12 move forward to positions under the travelling rails 8,8.

Figure 4:
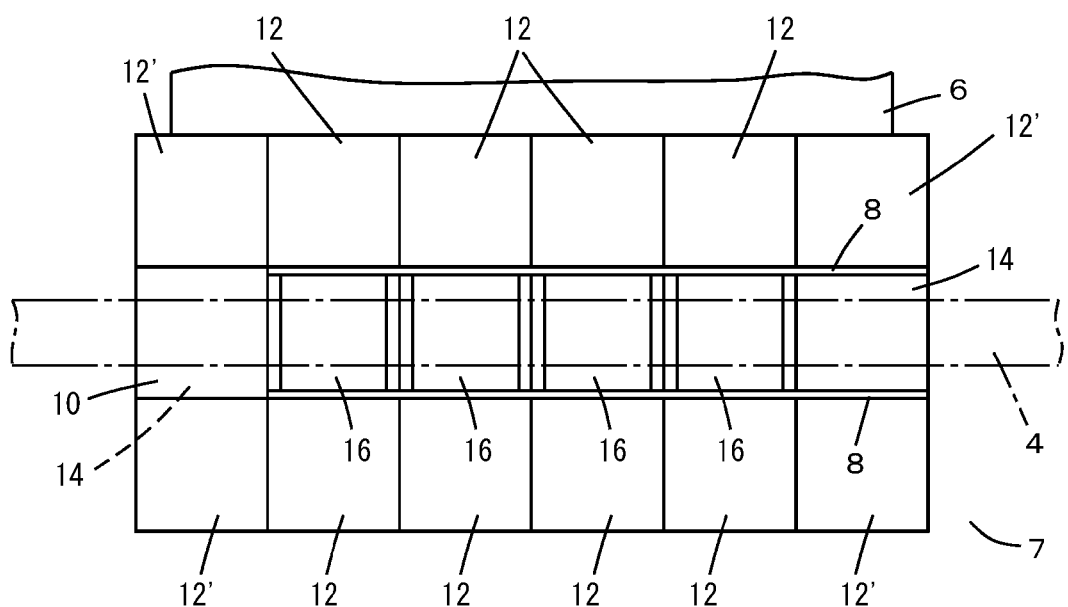
FIG. 4 is a plan view schematically showing main portions of a modification with an increased storage capacity.

The temporary storage apparatus 2 shown in FIGS. 1 to 3 is provided with four slidable buffers 12 and two fixed buffers 14, and the equipment 6 is provided with four load ports 16, for example. A temporary storage apparatus 40 with maximum capacity for storing carriers 18 and serving the four load ports 16 is shown in FIGS. 4 and 5. In the temporary storage apparatus 40, the fixed buffers 14 are located at positions lower than the slidable buffers 12 by a height corresponding to one carrier (FIG. 5), and consequently the occupation height of the temporary storage apparatus 40 is made larger. The slidable buffers 12 are provided on both sides of the travelling rails 8,8, and further slidable buffers 12' are provided at positions above the fixed buffers 14 and shifted from the load ports 16 so that they move forward over the fixed buffer. As a result, eight slidable buffers 12, four slidable buffers 12' separated from the load ports 16, and two fixed buffers 14 are provided, and positions over the fixed buffers 14 are the waiting positions for the local vehicle 10.

Figure 6:
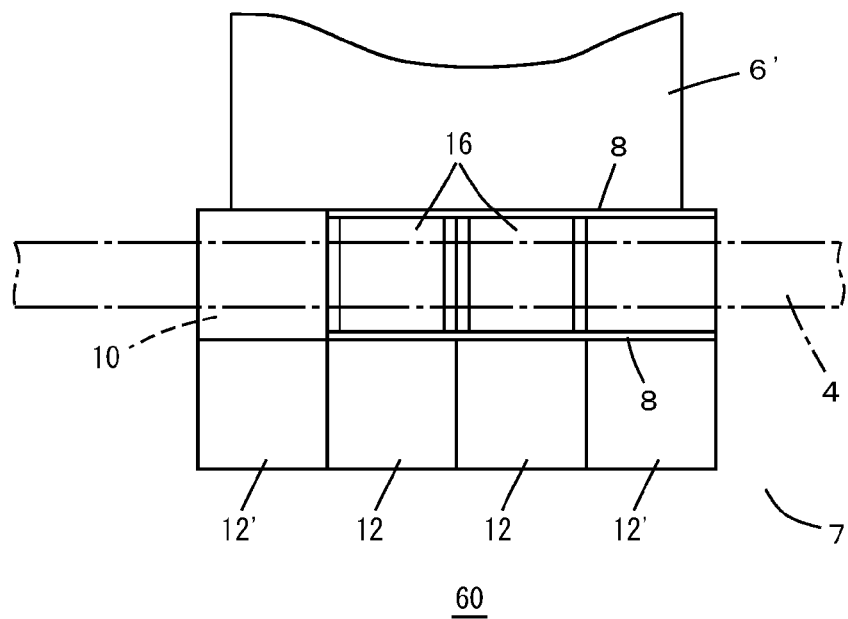
FIG. 6 is plan view schematically showing main portions of a modification for smaller equipment.

FIG. 6 shows a temporary storage apparatus 60 for small equipment 6' and with a smaller storage capacity. The equipment 6' is provided with two load ports 16, and the temporary storage apparatus 60 is provided with four slidable buffers. Positions over the slidable buffers 12' separated from the load ports 16 are the waiting positions for the local vehicle 10. While a structure similar to that shown in FIG. 5 allows two additional fixed buffers 14, it increases the height of the temporary storage apparatus 60.

Figure 7:
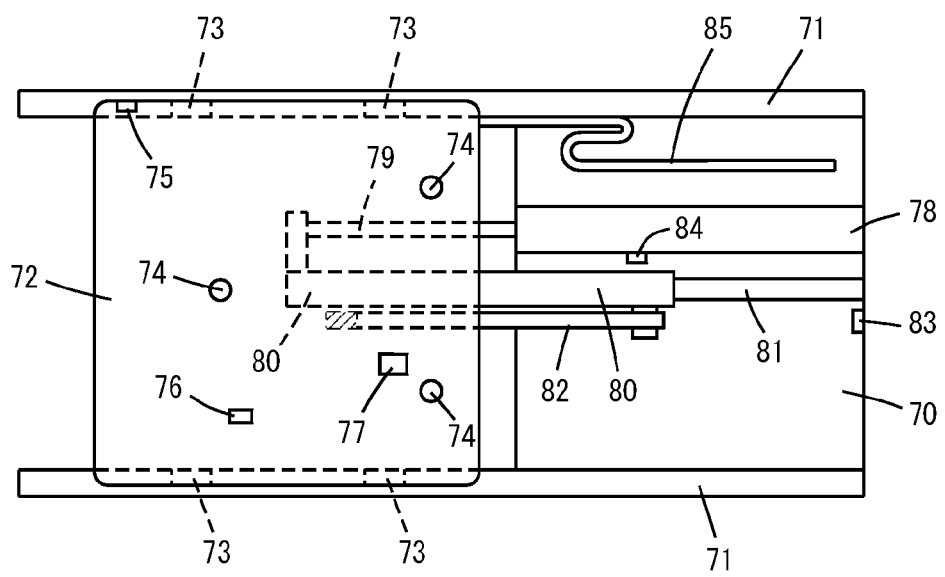
FIG. 7 is a plan view of a slidable buffer.

FIG. 7 shows the structure of the slidable buffer 12. Reference numeral 70 indicates a base fixed to the frame of the temporary storage apparatus, and a pedestal 72 moves back and forth between a forward position and a rearward position along rails 71 by wheels 73. The forward position is a position under the travelling rails for the local vehicle and, for example, over the load ports 16. The rearward position is laterally separated from the forward position. For example, three positioning pins 74 provided on the pedestal 72 position the bottom portion of the carrier 18. A carrier sensor 75 detects whether the carrier 18 is present, a seating sensor 76 detects whether the carrier 18 is seated at a correct position over the positioning pins 74, and an ID reader 77 reads the ID of the carrier. The ID reader 77 may be omitted, and both the sensors 75, 76 and the ID reader 77 are provided for the fixed buffers in the same manner.

A linear guide 80 is moved back and forth along a rail 81 by a cylinder 78 such as a pneumatic cylinder or a hydraulic cylinder and a piston 79 or by a motor and a toothed belt or the like (not shown). The pedestal 72 is moved back and forth by a double speed mechanism comprising a toothed belt 82 and so on, at twice the stroke of the linear guide 80. The double speed mechanism has been widely used in slide forks, and another mechanism may be adopted to move the pedestal 72 back and forth. A sensor 83 detects that the linear guide 80 is at a rearward position, and a sensor 84 detects that the linear guide 80 is at a forward position. A cable guide 85 guides a power supply line and a signal line bendably and connects the sensors 75, 76 and the ID reader 77 to the base 70. The sensors 83 and 84 act to detect the positions of the pedestal 72, and the rails 71 may be provided with, for example, an optical sensor for detecting the front end position of the pedestal and an optical sensor for detecting the rear end position of the pedestal.

Figure 8:
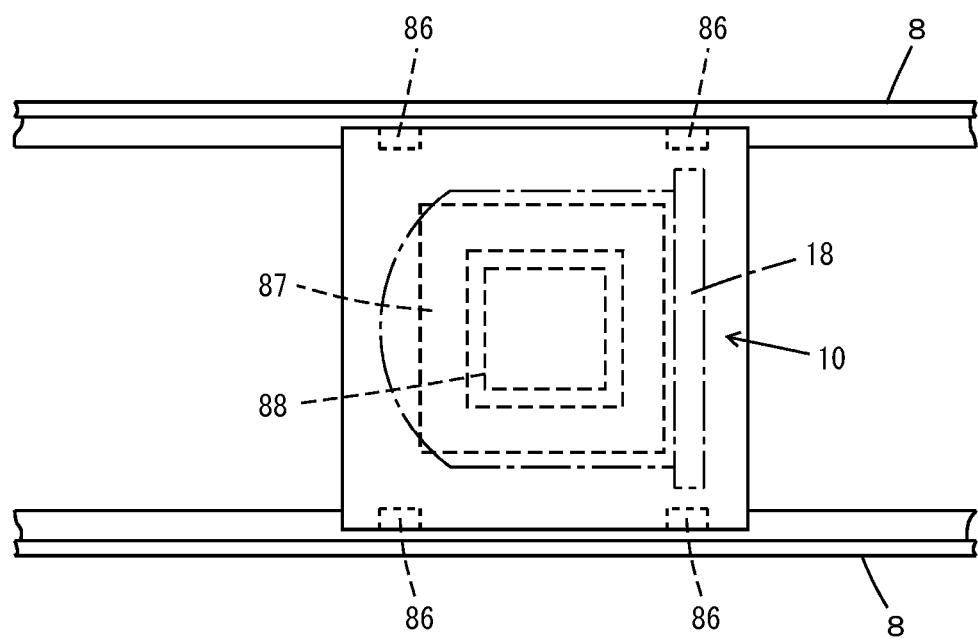
FIG. 8 is a plan view of a local vehicle.

FIG. 8 shows the structure of the local vehicle 10. The local vehicle 10 travels along the pair of travelling rails 8,8 by wheels 86 and a motor (not shown) and raises and lowers an elevation platform 88 that holds and releases the carrier 18 by a raising and lowering drive 87, belts (not shown), and so on. In addition to them, the local vehicle 10 is further provided with a communication device to communicate with the buffer controller 22, another communication device to communicate with a terminal 30 for interlock between the overhead travelling vehicle, a power supply such as a battery, and an on-board controller.

Figure 9:
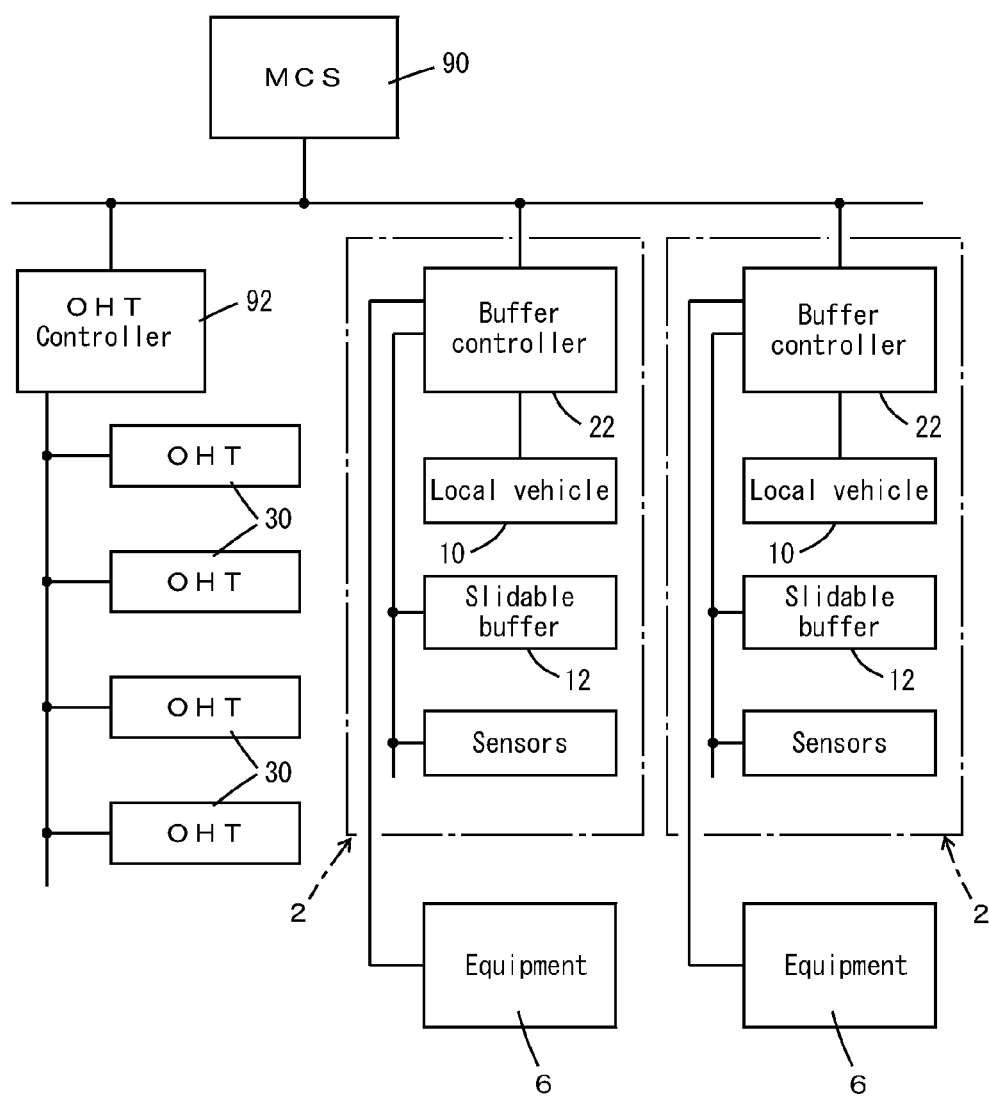
FIG. 9 is a block diagram showing a control system for controlling local vehicles and overhead travelling vehicles according to the embodiment.

FIG. 9 shows the temporary storage apparatuses 2 and control systems in the environment. A material control system (MCS) 90 communicates with a host controller (not shown) or the like, receives requests regarding the transport of carriers, and instructs an OHT controller 92 and the buffer controllers 22 to transport the carriers. The OHT controller 92 instructs a plurality of overhead travelling vehicles 30 to transport the carriers. The buffer controllers 22 instruct the local vehicles 10 to transport the carriers and control the back and forth movement of the slidable buffers 12. The buffer controllers 22:

detect the states of the temporary storage apparatuses 2 (the presence or absence of a carrier in each buffer and the position of each slidable buffer 12) by the optical sensor 20, the sensors 75 and 76, the ID reader 77, the sensors 83 and 84, terminals described later, and so on; and establish the interlock between the overhead travelling vehicles 30 and the local vehicles 10.

FIG. 10 shows an interlock mechanism between an overhead travelling vehicle 30 and a local vehicle 10. The optical sensor 20 detects the hoist of the overhead travelling vehicle 30, such as the belt and the elevation platform, or detects a carrier raised or lowered by the overhead travelling vehicle 30. Thus, the optical sensor 20 can detect that the overhead travelling vehicle 30 is transferring a carrier, as well as the stop position of the overhead travelling vehicle 30.

When the overhead travelling vehicle 30 transfers a carrier between a load port under the travelling rail, a fixed buffer, or a slidable buffer at a forward position under the travelling rails, the overhead travelling vehicle 30 requests the buffer controller 22 for transfer permission via the terminal 100. When the local vehicle 10 transfers a carrier between these positions, the local vehicle 10 requests the buffer controller 22 for transfer permission via the terminal 101.

The buffer controller 22 detects the position of the slidable buffer according to signals from the sensors 83 and 84 and checks whether a carrier is present in the slidable buffer or the fixed buffer. Then, if the transfer is possible, the buffer controller 22 permits the request. The buffer controller 22 also communicates with the equipment 6, forwards a request for the transfer of a carrier between a load port and the overhead travelling vehicle 30 or the local vehicle 10, and receives a permission signal from the equipment 6. Based on the above process, the buffer controller 22 transmits transfer permission to the overhead travelling vehicle 30 and the local vehicle 10 via the terminals 100 and 101. The transfer permission signals of the buffer controller 22 are set in the terminals 100 and 101, and the overhead travelling vehicle 30 and the local vehicle 10 perform transfer after checking the transfer permission.

The transfer processes by the local vehicle 10 and the overhead travelling vehicle 30 have been described, and transfer by the overhead travelling vehicle 30 may conflict with the entrance of the local vehicle 10. Therefore, the local vehicle 10 requests the buffer controller 22 via the terminal 101 for permission for each of the stop positions that the local vehicle 10 enters in advance. If there is no interference with transfer by the overhead travelling vehicle 30, the buffer controller 22 permits the request for entrance of the local vehicle 10 for each stop position. After checking the entrance permission signal via the terminal 101, the local vehicle 10 enters the permitted stop position.

The overhead travelling vehicle 30 can transfer a carrier between a slidable buffer located at the rearward position (a position not under the travelling rails for the local vehicle 10) by the lateral transfer device. This transfer does not interfere with the travelling of the local vehicle 10 or the transfer by the local vehicle 10. In this case, the overhead travelling vehicle 30 requests the buffer controller 22 via the terminal 102 for transfer permission, and the buffer controller 22 permits the request if the required slidable buffer is ready to be transferred. The terminals 102 and 100 may be integrated.

There may be interference between transfer between the load port and the fixed buffer by the overhead travelling vehicle 30 and the entrance (travelling) of the local vehicle 10, and this is avoidable by establishing the interlock via the terminals 100 and 101. Even if interlock established via the terminal 100 might not suffice, interference between the local vehicle 10 and the overhead travelling vehicle 30 is avoidable by detecting the belt, the elevation platform of the overhead travelling vehicle 30, carriers, and so on. Regarding transfer between the slidable buffer at the rearward position and the overhead travelling vehicle 30, the interlock may be established via the terminal 102. Furthermore, the buffer controller 22 may detect the position of the slidable buffer by the sensors 83 and 84.

These interlocks may be dealt with by a controller other than the buffer controller 22. If the buffer controller 22 has been notified by the local vehicle 10 of its position, the buffer controller 22 may request a built in interlock processing unit for entrance permission for the local vehicle 10 and may permit by itself to enter, without the communication between the terminal 101 and the local vehicle 10.

Figure 11:
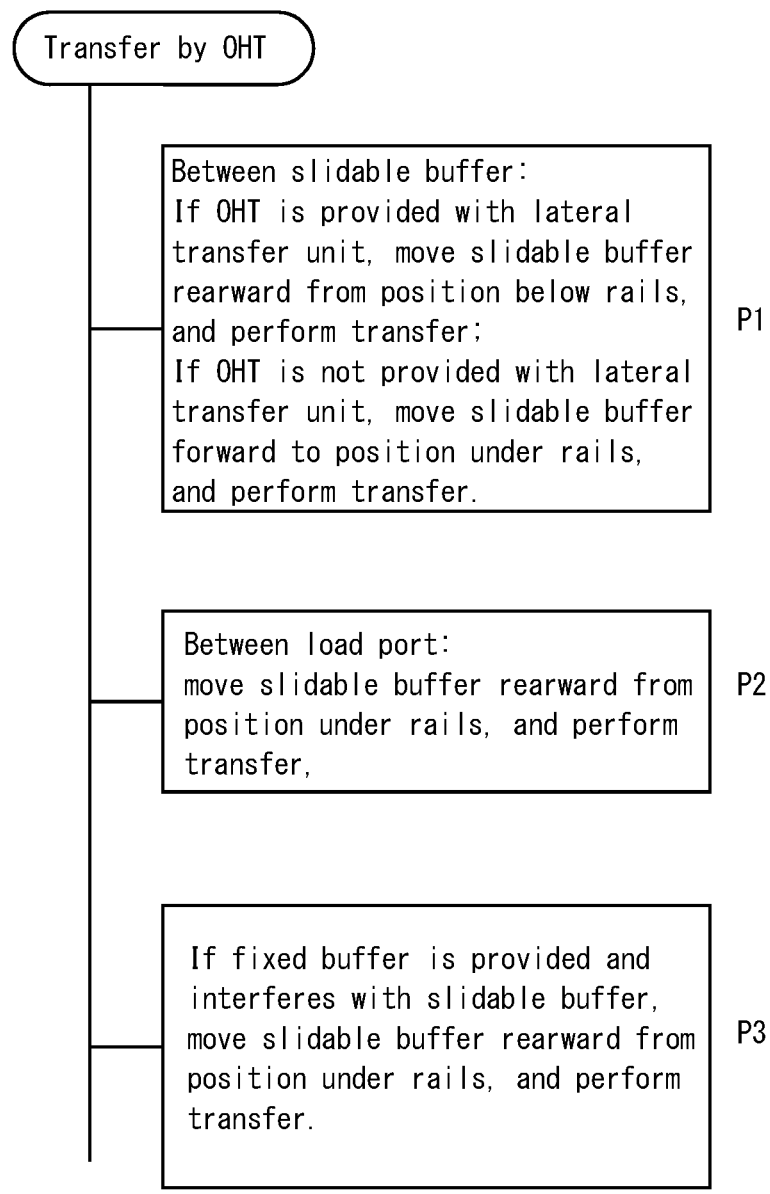
FIG. 11 is a transfer algorithm carried out by overhead travelling vehicles according to the embodiment.

FIG. 11 shows a transfer algorithm of an overhead travelling vehicle to transfer between the temporary storage apparatus. Regarding transfer between a slidable buffer (process P1) and the overhead travelling vehicle provided with the lateral transfer device, the slidable buffer moves rearward from a position under the travelling rails, and the transfer is performed at a rearward position without interference with the local vehicle. For the overhead travelling vehicle not provided with the lateral transfer device, the slidable buffer moves forward to a position under the travelling rails, and the transfer is performed at this position. Interlock in this case is the same as that for transfer between a load port.

Regarding transfer between a load port (process P2), the slidable buffer moves rearward from the position under the travelling rails 8,8 shown in FIG. 1, and the transfer is performed. Regarding transfer between a fixed buffer (process P3), if a slidable buffer is present over the fixed buffer as shown in FIG. 5, the slidable buffer moves rearward from the position over the fixed buffer, and the transfer is performed.

Figure 12:
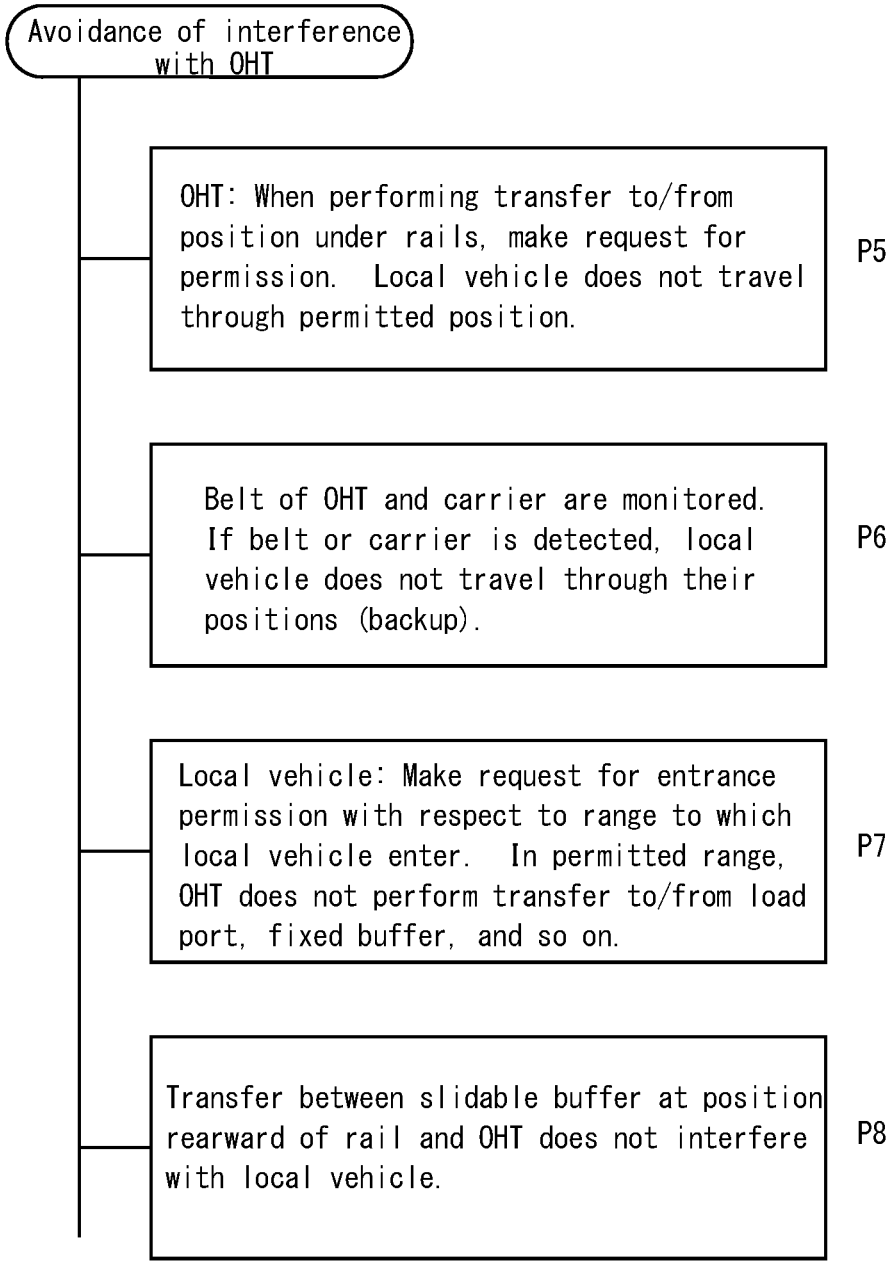
FIG. 12 is a diagram showing an avoidance algorithm for avoiding interference between an overhead travelling vehicle and a local vehicle according to the embodiment.

FIG. 12 shows an algorithm for avoiding interference between an overhead travelling vehicle and a local vehicle. When transferring a carrier between a slidable buffer located under the travelling rails for the local vehicle, a load port, or a fixed buffer, the overhead travelling vehicle (OHT) requests for transfer permission via a terminal in advance. The local vehicle requests for entrance permission for each of the stop positions to enter and makes a further request for transfer permission for transfer in addition to the entrance permission. For the same stop position, only one request out of the transfer request from the overhead travelling vehicles and the entrance request from the local vehicle may be permitted, and the interference between the overhead travelling vehicles and the local vehicle is avoided (process P5).

If an error within an overhead travelling vehicle occurs after the start of transfer between a load port and so on, in some cases the overhead travelling vehicle may not transmit to the terminal a signal indicating the transfer being performed. In this situation, the buffer controller might be unable to recognize that the overhead travelling vehicle is performing transfer. This problem may be solved by making the buffer controller store in a non-volatile memory the information that the overhead travelling vehicle is performing transfer, however, this problem may be more reliably solved by detecting the hoist of the overhead travelling vehicle, a carrier raised or lowered, or the like by the optical sensors 20 shown in FIG. 1. Therefore, if the hoist or the like is detected, the entrance of the local vehicle to the detected stop position is prohibited (process P6).

The local vehicle is configured and programmed to make a request for entrance for each of the stop positions. The buffer controller is configured and programmed not to permit transfer by the overhead travelling vehicle regarding positions already permitted to enter to the local vehicle (process P7). Note that regarding transfer between slidable buffers not under the travelling rails 8,8 shown in FIG. 1, no interference will occur with the local vehicle. Therefore, the interference avoidance process is not necessary (process P8).

Figure 13:
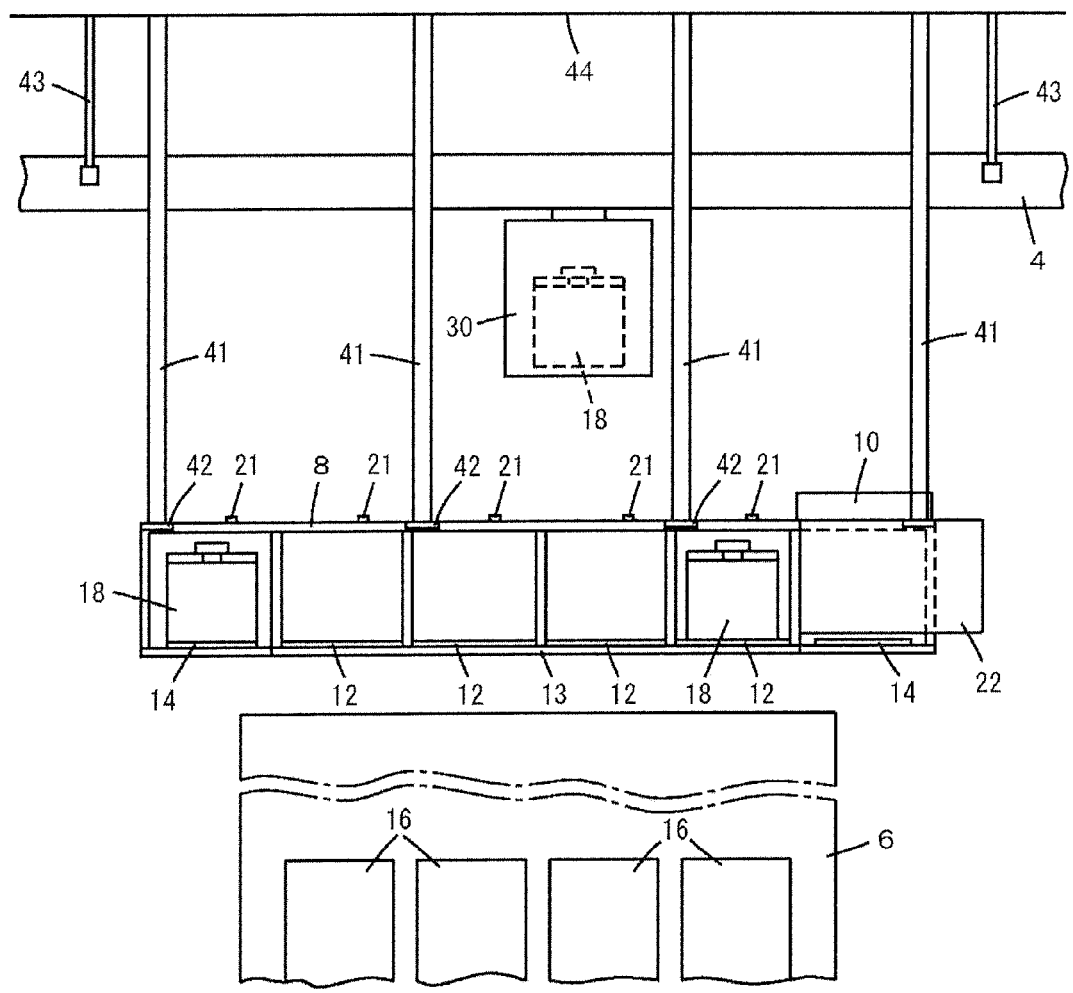
FIG. 13 is a partially cut-out side view of a modification in which a temporary storage apparatus for carriers is supported by a pillar from a ceiling.

As shown in FIG. 13, the temporary storage apparatus 2 may be supported from a ceiling 44 of the cleanroom by pillars 41 and connection portions 42, and the trestles 24 may be omitted. Reference numeral 43 denotes a pillar of the travelling rails 4 for the overhead travelling vehicle 30.

LIST OF REFERENCE NUMERALS 2, 40, 60 temporary storage apparatus for storing carriers (temporary storage apparatus)
4: travelling rail for overhead travelling vehicles 6: equipment 7: passage
8: travelling rail for local vehicles 10: local vehicle
12: slidable buffer 13: frame 14: fixed buffer
16: load port 18: carrier 20: optical sensor
21: reflection plate 22: buffer controller (controller)
24: trestle 25, 26: front face 30: overhead travelling vehicle (OHT)
32: travelling section 33: lateral transfer mechanism 34: raising and lowering drive
35: elevation platform 36: belt 38: anti-fall hood
44: ceiling 41, 43: pillar 42: connection portion
70: base 71: rail 72: pedestal 73: wheel
74: positioning pin 75: carrier sensor 76: seating sensor
77: ID reader 78: cylinder 79: piston
80: linear guide 81: rail 82: toothed belt
83, 84: sensor 85: cable guide 86: wheel
87: raising and lowering drive 88: elevation platform
90: material control system (MCS)
92: OHT controller 100 to 102: terminal

What is claimed is:

1. A transport system for transporting carriers between load ports of equipment, comprising:
    overhead travelling vehicles provided with a hoist raising and lowering carriers and a lateral transfer mechanism laterally moving the hoist;
    a travelling rail for the overhead travelling vehicles provided in a ceiling space of a building and passing over a load port;
    a local vehicle provided with a hoist for raising and lowering carriers;
    a travelling rail for the local vehicle, provided at a position below the travelling rail for the overhead travelling vehicles and over the load port;
    at least one slidable buffer configured to slide between a forward position under the travelling rail for the local vehicle and a rearward position laterally separated from the position under the travelling rail for the local vehicle and to support a carrier thereon; and
    a buffer controller configured and programmed to control the local vehicle and the slidable buffer,
    wherein a space above the slidable buffer at the rearward position is open for transfer of carriers, wherein the overhead travelling vehicles are configured and programmed to transfer carriers between the load port and the slidable buffer located at the rearward position, wherein the local vehicle is configured to transfer carriers between the load port and the slidable buffer located at the forward position, wherein the travelling rail for the local vehicle extends from the position over the load port to a waiting position for the local vehicle shifted from the position over the load port, wherein the local vehicle is configured to wait at the waiting position, wherein terminals are provided along the travelling rail for the overhead travelling vehicles for communication between the overhead travelling vehicles and the buffer controller; and wherein terminals are provided along the travelling rail for the local vehicle for communication between the local vehicle and the buffer controller, wherein a sensor configured to detect the slidable buffer located at the rearward is provided, wherein the overhead travelling vehicles are configured and programmed to request the buffer controller via a terminal for permission to transfer between the load port prior to transfer between the load port, and wherein the buffer controller is configured and programmed to permit via a terminal the overhead travelling vehicles to transfer between the load port if there is no interference with entrance of the local vehicle and if the slidable buffer is located at the rearward position.

2. The carrier transport system according to claim 1, further comprising at least one fixed buffer configured to support carriers thereon and provided at a position under the travelling rail for the local vehicle, including an area under the waiting position and not over the load port.

3. The carrier transport system according to claim 1,
wherein the slidable buffer includes a slidable buffer configured to slide to one side of the travelling rail for the local vehicle and a slidable buffer configured to slide to another side of the travelling rail for the local vehicle, wherein the lateral transfer mechanism of the overhead travelling vehicles is configured to laterally move the hoist to both sides of the travelling rail for the overhead travelling vehicles, and wherein the overhead travelling vehicles are configured and programmed to transfer carriers between slidable buffers located at the rearward position, for both the slidable buffer configured to slide to one side and the slidable buffer configured to slide to another side.

4. The carrier transport system according to claim 1,
wherein the slidable buffer comprises a base fixed at the rearward position and a movable pedestal movable back and forth between the forward position and a position over the base, wherein a sensor configured to detect the pedestal located at the forward position and a sensor configured to detect the pedestal located at the position over the base are further provided, wherein the local vehicle is configured and programmed to request the buffer controller via a terminal for permission to enter a position over the load port prior to entering and permission to transfer between the slidable buffer prior to transfer, wherein the overhead travelling vehicles are configured and programmed to request the buffer controller via a terminal
for permission to transfer between the
slidable buffer prior to transfer between the slidable buffer, wherein the buffer controller is configured and programmed
to permit via a terminal the local vehicle to enter if there is no interference with transfer between the overhead travelling vehicles and the load port,
to permit via a terminal the local vehicle to transfer if the slidable buffer is located at said forward position, and
to permit via a terminal the overhead travelling vehicles to transfer between the
slidable buffer if the slidable buffer is located at said rearward position.

5. A carrier transport method for transporting carriers between load ports of equipment,
with usage of a transport system comprising:
overhead travelling vehicles provided with a hoist raising and lowering carriers and a lateral transfer mechanism laterally moving the hoist;
a travelling rail for the overhead travelling vehicles provided in a ceiling space of a building and passing over a load port;
a local vehicle provided with a hoist for raising and lowering carriers;
a travelling rail for the local vehicle, provided at a position below the travelling rail for the overhead travelling vehicles and over the load port;
at least one slidable buffer configured to slide between a forward position under the travelling rail for the local vehicle and a rearward position laterally separated from the position under the travelling rail for the local vehicle and configured to support a carrier thereon; and
a buffer controller configured and programmed to control the local vehicle and the slidable buffer,
wherein a space above the slidable buffer at the rearward position is open for transfer of carriers, and
wherein the travelling rail for the local vehicle extends from the position over the load port to a waiting position for the local vehicle shifted from the position over the load port,
wherein terminals are provided along the travelling rail for the overhead travelling vehicles for communication between the overhead travelling vehicles and the buffer controller; and
wherein terminals are provided along the travelling rail for the local vehicle for communication between the local vehicle and the buffer controller,
wherein a sensor configured to detect the slidable buffer located at the rearward position is provided,
said method comprising:
transferring carriers by the overhead travelling vehicles between the load port and the slidable buffer located at the rearward position;
transferring carriers by the local vehicle between the load port and the slidable buffer located at the forward position; and
making the local vehicle wait at the waiting position,
wherein the overhead travelling vehicles are configured and programmed to request the buffer controller via a terminal for permission to transfer between the load port prior to transfer between the load port, and
permitting by the buffer controller via a terminal to the overhead travelling vehicles to transfer between the load port if there is no interference with entrance of the local vehicle and if the slidable buffer is located at the rearward position.

6. The carrier transport method according to claim 5, wherein the slidable buffer of the transport system includes a slidable buffer configured to slide to one side of the travelling rail for the local vehicle and a slidable buffer configured to slide to another side of the travelling rail for the local vehicle, and the lateral transfer mechanism of the overhead travelling vehicles is configured to laterally move the hoist to both sides of the travelling rail for the overhead travelling vehicles, and the carrier transport method further comprising transferring carriers by the overhead travelling vehicles between slidable buffers located at the rearward position for both the slidable buffer configured to slide to one side and a slidable buffer configured to slide to another side.

7. The carrier transport method according to claim 5, wherein the slidable buffer comprises a base fixed to the rearward position and a movable pedestal moving back and forth between the forward position and a position over the base, the carrier transport method further comprising:

detecting the pedestal located at the forward position by a first sensor, and detecting the pedestal located at the position over the base by a second sensor;

requesting from the local vehicle to the buffer controller via terminals for permission to enter a position over the load port prior to entering, and permission to transfer between the slidable buffer prior to transfer;

requesting by the overhead travelling vehicles to the buffer controller via terminals for permission to transfer between the slidable buffer prior to transfer between the slidable buffer;

permitting by the buffer controller to the local vehicle via terminals to enter if there is no interference with transfer between the overhead travelling vehicles and the load port and to transfer if the slidable buffer is located at said forward position; and permitting by the buffer controller to the overhead travelling vehicles via terminals to transfer between the slidable buffer if the slidable buffer is located at said rearward position.

\* \* \* \* \*